United States Patent
Mitros et al.

(10) Patent No.: US 8,067,795 B2
(45) Date of Patent: Nov. 29, 2011

(54) SINGLE POLY EEPROM WITHOUT SEPARATE CONTROL GATE NOR ERASE REGIONS

(75) Inventors: Jozef Czeslaw Mitros, Richardson, TX (US); Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 745 days.

(21) Appl. No.: 11/716,785

(22) Filed: Mar. 12, 2007

(65) Prior Publication Data

US 2008/0225593 A1 Sep. 18, 2008

(51) Int. Cl.
*H01L 29/76* (2006.01)
(52) U.S. Cl. ........ 257/314; 257/315; 257/316; 257/317; 257/318; 257/319; 257/320
(58) Field of Classification Search ........... 257/314–320
See application file for complete search history.

(56) References Cited

U.S. PATENT DOCUMENTS

| | | | | |
|---|---|---|---|---|
| 5,751,635 A | * | 5/1998 | Wong et al. | 365/185.19 |
| 6,031,771 A | * | 2/2000 | Yiu et al. | 365/200 |
| 6,044,018 A | * | 3/2000 | Sung et al. | 365/185.18 |
| 7,489,550 B2 | * | 2/2009 | Tanaka | 365/185.18 |

* cited by examiner

*Primary Examiner* — Samuel Gebremariam
(74) *Attorney, Agent, or Firm* — Rose Alyssa Keagy; Wade J. Brady, III; Frederick J. Telecky, Jr.

(57) ABSTRACT

A single-poly EEPROM memory device comprises source and drain regions in a semiconductor body, a floating gate overlying a portion of the source and drain regions, which defines a source-to-floating gate capacitance and a drain-to-floating gate capacitance, wherein the source-to-floating gate capacitance is substantially greater than the drain-to-floating gate capacitance. The source-to-floating gate capacitance is, for example, at least about three times greater than the drain-to-floating gate capacitance to enable the memory device to be electrically programmed or erased by applying a potential between a source electrode and a drain electrode without using a control gate. A current path between the source and drain electrodes generally defines current carrying portions of the source and drain regions, and a non-current carrying portion of the source region residing outside the current carrying portion, wherein substantially more of the floating gate overlies the non-current carrying portion than the current carrying portions.

27 Claims, 6 Drawing Sheets

| OPERATION | Single Poly EEPROM Exp. A | | | Single Poly EEPROM Exp. B | | |
| --- | --- | --- | --- | --- | --- | --- |
| | Vd | Vs | Vbg | Vd | Vs | Vbg |
| PROGRAM (V) | -11 | 0 | 0 | -11 | 0 | 0 |
| ERASE (V) | 0 | -11 | 0 | FLOAT | -11 | 0 |
| READ (V) | -1 | 0 | 0 | -1 | 0 | 0 |

Vbg = Back gate Voltage at n-well potential
Vd = Drain Voltage
Vs = Source Voltage

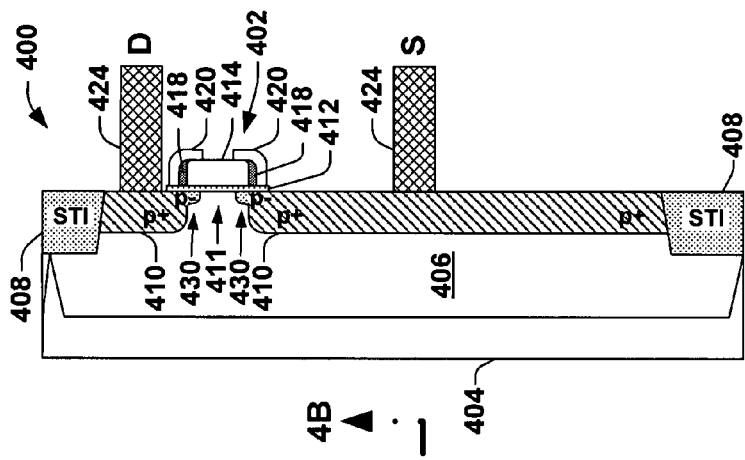
FIG. 4C
EEPROM 1
FIG. 4B
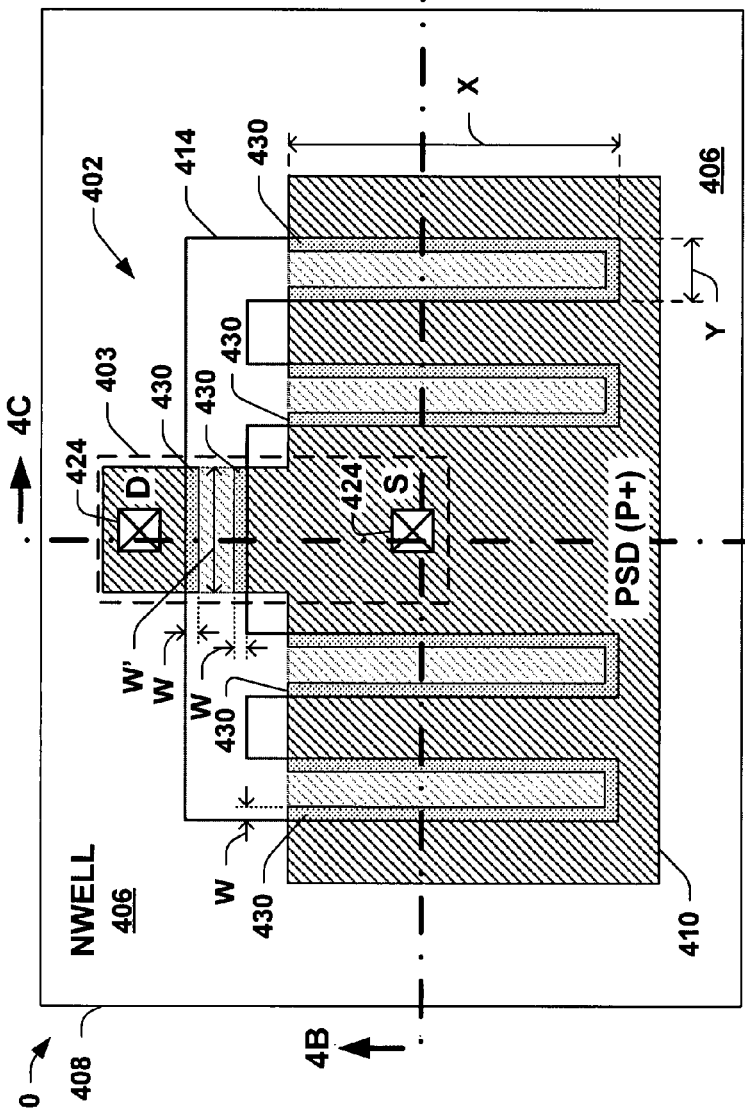
FIG. 4A

EEPROM 2

SINGLE POLY EEPROM WITHOUT SEPARATE CONTROL GATE NOR ERASE REGIONS

FIELD OF THE INVENTION

The present invention relates generally to semiconductor device fabrication, and more particularly, to a modified OTP EPROM implemented as a single-poly EEPROM without separate control gate or erase regions, while enabling electrical programming and erasing operations in a lower cost memory device having significantly reduced area.

BACKGROUND OF THE INVENTION

One time programmable (OTP) electrically programmable read only memory (EPROM) can be an effective, low cost mechanism for providing non-volatile memory in a variety of computer related applications, such as in small handheld digital devices like cellular telephones, personal digital assistants (PDA's), etc.

The OTP EPROM has the advantage of only requiring a small area, for example, about 4 $\mu m^2$, but can be programmed only once. In addition, OTP EPROM is not electrically erasable without utilizing the expensive and very inconvenient UV erasure technologies.

Single-polysilicon electrically erasable programmable read only memory, herein, (single-poly EEPROM) utilize another simple fabrication process and can be programmed multiple times, but require a large area, for example, of about 50 $\mu m^2$. This large area is generally needed because of the spacing requirements to accommodate the relatively high voltage requirements of electrically programming and erasing single-poly EEPROM.

Accordingly, it would be desirable to have a relatively small memory device that can be electrically programmed and erased, while utilizing the simpler and lower cost fabrication technology of a single-poly device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention comprises an EEPROM memory device that can be electrically programmed or erased without the use of a control gate, thereby requiring less device area. In one embodiment, the EEPROM can be programmed or erased by applying a potential between a source electrode and a drain electrode without using a control gate.

According to one or more aspects of the present invention, the single-poly EEPROM memory device comprises source and drain regions in a semiconductor body, and a floating gate overlying a portion of the source and drain regions. The source and drain regions define a drain-to-floating gate capacitance and a source-to-floating gate capacitance, wherein the source-to-floating gate capacitance (Cs/fg) is substantially greater than the drain-to-floating gate capacitance (Cd/fg). This relationship may be referred to as: Cs/fg>Cd/fg, or Cs/fg>>Cd/fg, which generally forms a significant portion of the coupling ratio Cr, which will be discussed in greater detail infra.

By making the source-to-floating gate capacitance Cs/fg substantially larger than the drain-to-floating gate capacitance Cd/fg, the inventors have appreciated that a capacitive voltage divider is created which may be used to remove electrons from the gate for an erase operation, and to push electrons onto the floating gate during program operations, without the use of a control gate. Thus, by eliminating the separate control gate and tunneling regions used in the priorart, significant device area may be saved.

In one aspect, the source-to-floating gate capacitance is at least about three times greater than the drain-to-floating gate capacitance to enable the memory device to be electrically programmed or erased, for example, by applying a potential between a source electrode and a drain electrode without using a control gate.

In another aspect of the invention, a current path between the source and drain electrodes generally defines current carrying portions of the source and drain regions, and a noncurrent carrying portion of the source region residing outside the current carrying portion. In one example, the non-current carrying portion of the source region is at least about three times larger than, and preferably about five times larger than the current carrying portions.

In accordance with yet another aspect of the present invention, the memory device, the non-current carrying portion of the source region generally residing outside the current carrying portion of the source region, comprises one of, a portion of the source region that extends in a direction tangential to the current path, and a portion of the source region that extends in a direction along the current path and beyond the source electrode.

In one embodiment, a memory device comprises source and drain regions in a semiconductor body of a first conductivity type, and a floating gate overlying a portion of the source and drain regions, wherein substantially more of the floating gate overlies the source region than the drain region.

In another aspect, the portion of the floating gate overlying the source region is sufficiently larger than the portion of the floating gate overlying the drain region to enable the memory device to be electrically programmed and erased.

In still another aspect, a p-type source/drain dopant (PSD) for a p-MOS device, or n-type source/drain dopant (NSD) for an n-MOS device, may be employed. For example, the PSD pattern and implant in an n-well active region defines the source/drain regions of a p-MOS device, while the NSD pattern and implant in a p-well active region defines the source/drain regions of an n-MOS device. Hence, either the PSD source/drain dopant implant type or the NSD source/drain dopant implant type may be referred to as a first conductivity type dopant in a semiconductor body.

Thus a simple and cost effective EEPROM memory device having a reduced size may be embedded with common CMOS devices to reduce wafer manufacturing costs.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of only a few of the various ways in which the principles of the invention may be employed. Other objects, advantages, and novel features of the invention will become apparent from the following detailed description of the invention when considered in conjunction with the drawings.

BRIEF DESCRIPTION OF THE DRAWINGS

FIGS. 3C and 3D are schematic diagrams of the circuit capacitances between electrodes of the memory device of FIG. 3A, further illustrating the capacitive voltage dividers formed during program and erase memory operations, respectively, such as may be accomplished in an exemplary single-poly EEPROM memory device of the present invention.

FIGS. 4A-4C are cross sectional front, top plan, and cross sectional side views, respectively, of an embodiment of a EEPROM memory device (EEPROM1) at a later stage of fabrication, the device having a source-to-floating gate capacitance that is substantially larger than the drain-to-floating gate capacitance in accordance with an aspect of the present invention.

DETAILED DESCRIPTION OF THE INVENTION

The present invention will now be described with respect to the accompanying drawings in which like numbered elements represent like parts. The figures provided here and the accompanying description of the figures are merely provided for illustrative purposes. One of ordinary skill in the art should realize, based on the instant description, other implementations and methods for fabricating the devices and structures illustrated in the figures and in the following description.

As indicated, conventional OTP EPROM memory devices have the advantage of requiring only a small area, for example, about 4 $\mu m^2$, but can be programmed only once with a relatively high voltage. OTP EPROM may also require various fairly complicated testing procedures and is not electrically erasable without utilizing expensive and very inconvenient UV erasure technologies.

Single-poly EEPROM (single-polysilicon electrically erasable programmable read only memory) utilize another simple fabrication process. Single-poly EEPROM memory devices can be programmed multiple times but require a large area, for example, about 50 $\mu m^2$. This large area is generally due in part to the separation required between the control gate and the read metal oxide semiconductor (MOS) transistor to accommodate the relatively high voltage requirements of electrically programming and erasing single-poly EEPROM.

Accordingly, the present invention provides a relatively small (e.g., about <10 $\mu m^2$) memory device that can be electrically programmed and erased, thereby providing EEPROM functionality, while still utilizing the simpler and lower cost single-poly fabrication technology.

In particular, the present invention provides a modified OTP EPROM or single-poly EEPROM memory device comprising source and drain regions in a semiconductor body, a floating gate overlying a portion of the source and drain regions, which defines a drain-to-floating gate capacitance and a source-to-floating gate capacitance, wherein the source-to-floating gate capacitance is substantially greater than the drain-to-floating gate capacitance. The source-to-floating gate capacitance is, for example, at least about three times greater, preferably about five times greater, and generally less than about twenty times greater than the drain-to-floating gate capacitance, which enables the memory device to be electrically programmed or erased by applying a potential between a source electrode and a drain electrode without the use of a control gate. Thus, by removing the need for a control gate, the device real-estate required to separate the control gate from the read metal oxide semiconductor (MOS) transistor may be greatly reduced, for example, from about 50 $\mu m^2$ to about <10 $\mu m^2$. These and other aspects of the invention will become more apparent in light of the figures and accompanying descriptions.

Figure 1A:
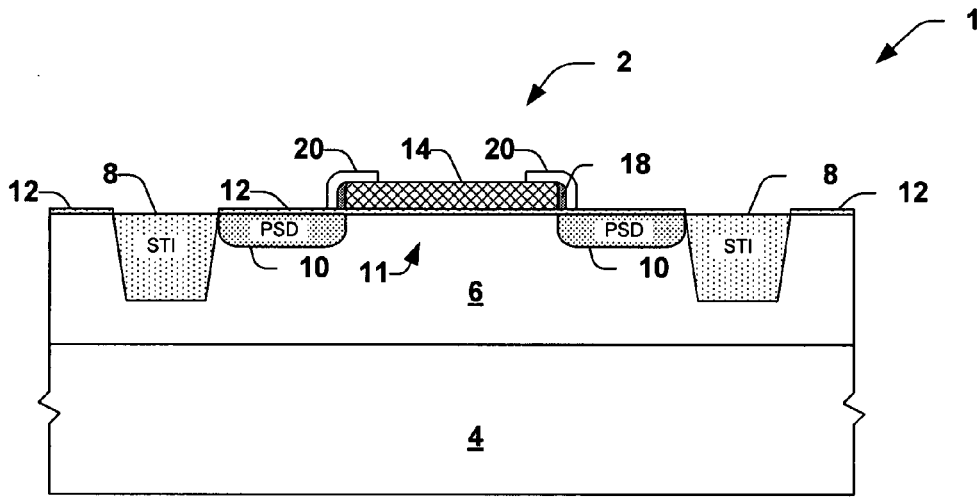
FIGS. 1A-1C are cross sectional front, top plan, and cross sectional side views, respectively, of a prior art floating gate memory device such as an OTP EPROM memory device, illustrating source, drain, and channel regions of the device.
Figure 1B:
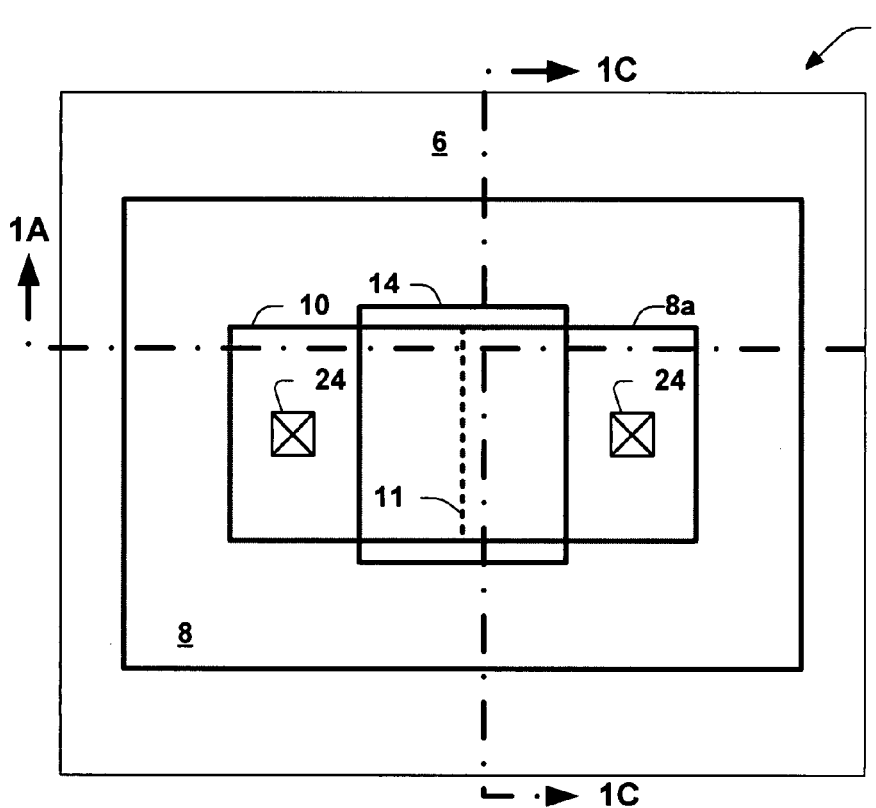
Figure 1C:
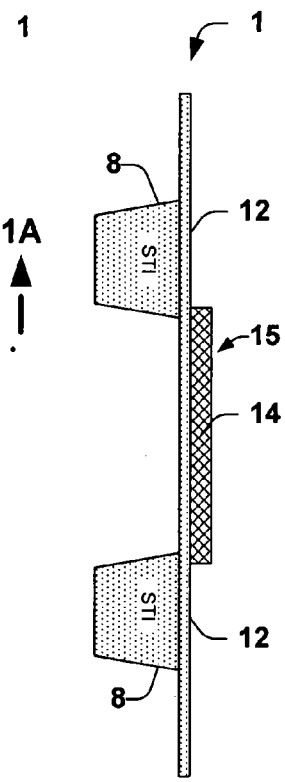

For example, FIGS. 1A-1C illustrate cross sectional front, top plan, and cross sectional side views, respectively, of a prior art floating gate memory device 1, further illustrating source, drain, and channel regions. Memory device 1 comprises a PMOS OTP EPROM transistor 2 fabricated overlying a p+ substrate 4, and the transistor 2 residing within an n-well 6. Prior art device 1 is shown at a stage of fabrication wherein an isolation structure or barrier 8 is utilized to define the outermost boundaries of the active source/drain (S/D) regions 10 (PSD for a PMOS device in the example), and a channel region 11 formed therebetween. Device 1 is also shown having a gate oxide layer 12 that is generally selectively grown by a thermal oxidation process overlying the active or non-isolation barrier areas.

Prior art device 1 further includes a doped polysilicon gate layer 14, overlying a portion of the active source/drain regions 10 and the gate oxide layer 12. The polysilicon gate layer 14 is formed over the gate oxide layer 12, while sidewall spacers 18 and 20 are provided to insulate the sidewalls of gate 14 and aid in shaping subsequent source and drain implant operations. Subsequent formation of conductive contact pads 24 permit electrical connections to the S/D regions 10. The inner boundary 8a of the STI structure 8 defines the outermost boundary of the PSD or S/D regions 10 of the prior art device 1 of FIGS. 1A-1C.

Figure 2A:
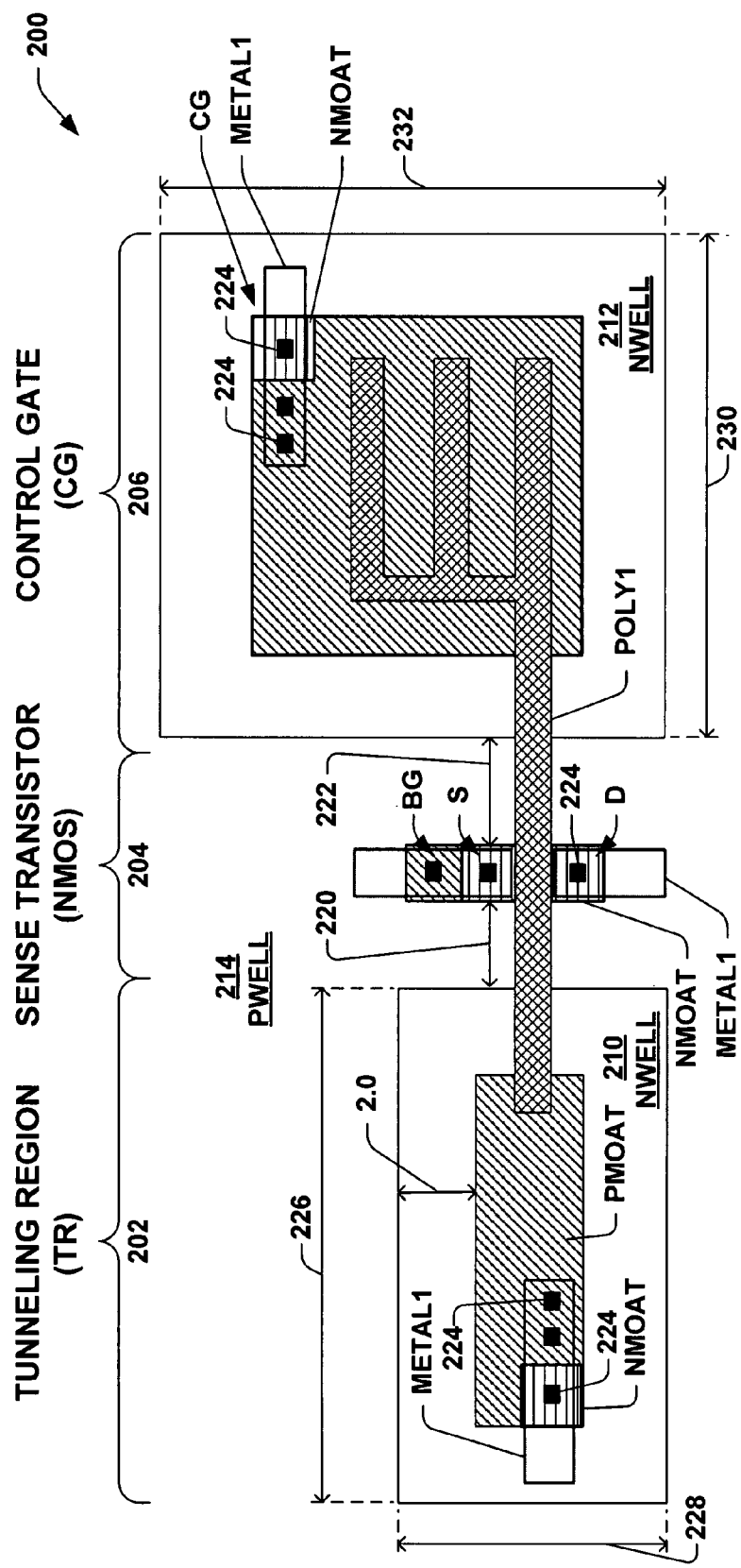
FIG. 2A is a top plan view of a conventional single-poly electrically erasable and programmable "read only" memory (EEPROM) employing a tunneling region (TR), a sense transistor, and a control gate region (CG) formed in a semiconductor substrate.

FIG. 2A illustrates a conventional single-poly EEPROM device 200, employing a tunneling region (TR) 202, an NMOS sense transistor 204, and a control gate (CG) 206, such as may be formed in a semiconductor substrate. The tunneling region TR 202 and the control gate CG 206 are formed in separate n-well regions 210 and 212 respectively, separated by the NMOS sense transistor 204 formed in a p-well region 214 therebetween. Sense transistor 204 has source S, drain D, and back-gate BG terminals at contacts 224, such as may be formed in or above the metal 1 or METAL1 layer along with the CG terminal of the control gate CG 206, and the NMOAT terminal of the tunneling region TR 202.

To accommodate the high voltage requirements of the single-poly EEPROM device 200, the sense transistor 204 is spaced a distance 220 (e.g., about 2 nm) from the tunneling region TR 202, and a distance 222 (e.g., about 3 nm) from the control gate CG 206. The tunneling region TR 202 has a width dimension 226 (e.g., about 14 nm) and a height dimension 208 (e.g., about 7 nm), while the control gate 206 has a width dimension 230 (e.g., about 13 nm) and a height dimension 232 (e.g., about 13 nm). Because of all these individual regions as well as the spacings between the regions, the overall area required of the conventional single-poly EEPROM may be quite large. Accordingly, by removing the need for a control gate, the present invention offers a device having a greatly reduced device area requirement.

Figure 2B:
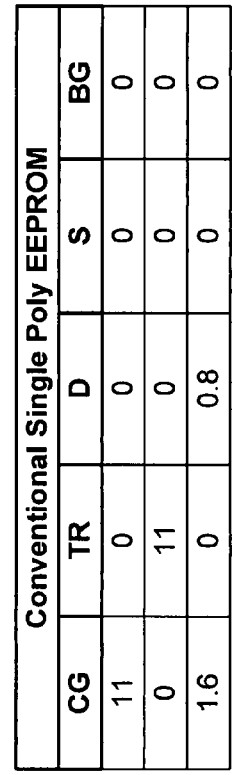
FIG. 2B is a memory operations chart for the conventional single-poly EEPROM of FIG. 2A, illustrating the voltages required at the various memory device electrodes employed for program, erase, and read operations.

FIG. 2B illustrates a chart of typical operational voltage requirements of the conventional single-poly EEPROM 200 of FIG. 2A. The chart of FIG. 2B illustrates the voltages required at the various memory device electrodes employed for program, erase, and read operations. For example, to program the single-poly EEPROM 200, 11 volts is applied to the control gate electrode CG of the control gate CG region 206, while 0 volts is applied to the tunneling region electrode TR in the tunneling region 202, the drain electrode D, the source electrode S, and the back-gate electrode BG of the sense transistor 204.

Figure 3A:
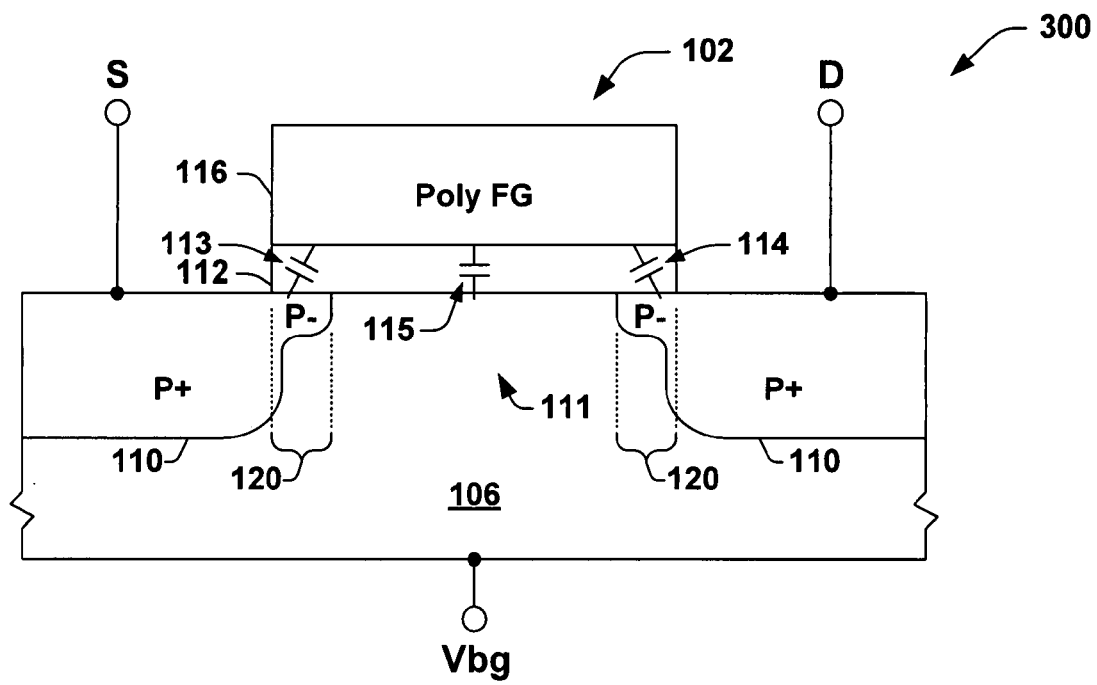
FIG. 3A is a cross-sectional view of a conventional floating gate memory device such as that of FIG. 1A-1C, illustrating the general locations that device capacitances may be formed between the floating gate and the source (S), drain (D), and back-gate (BG) electrodes.

FIG. 3A illustrates a conventional floating gate memory device 300 such as that of the PMOS type OTP EPROM memory device 1 of FIG. 1A-1C. PMOS Memory device 300 comprises a source electrode S in a P+ doped source/drain region (PSD) 110 formed in an N-well 106, a drain electrode D in another P+ doped source/drain region (PSD) 110 formed in the N-well 106, and a channel region 111 therebetween. Memory device 300 further includes a gate 102, comprising a gate oxide layer 112 formed overlying the source/drain regions 110, and a polysilicon gate 116 formed over the gate oxide layer 112. Memory device 300 further illustrates the general locations in the device that capacitances may be formed between the floating gate and the source (S), drain (D), and back-gate (BG) electrodes. For example, the capacitance formed between the source S and the floating-gate is capacitance Cs/fg 113; the capacitance formed between the drain D and the floating-gate is capacitance Cd/fg 114; and the capacitance formed between the back-gate BG and the floating-gate is capacitance Cbg/fg 115.

The source capacitance Cs/fg 113 and drain capacitance Cd/fg 114 are each essentially defined by the area of a P− doped extension region 120, implanted into the PSD regions 110, underlying the floating gate FG 116 and the thickness of the gate oxide layer 112. For example, if this P-doped extension region extends deeply under the floating-gate, if the channel width (into the page) is great, and/or if the gate oxide is very thin, these capacitances may be larger. Typically, however, in the prior art OTP EPROM memory devices, such as that of memory device 1 of FIG. 1A-1C, the source capacitance Cs/fg 113 and the drain capacitance Cd/fg 114 are fabricated to be substantially equal.

Figure 3B:
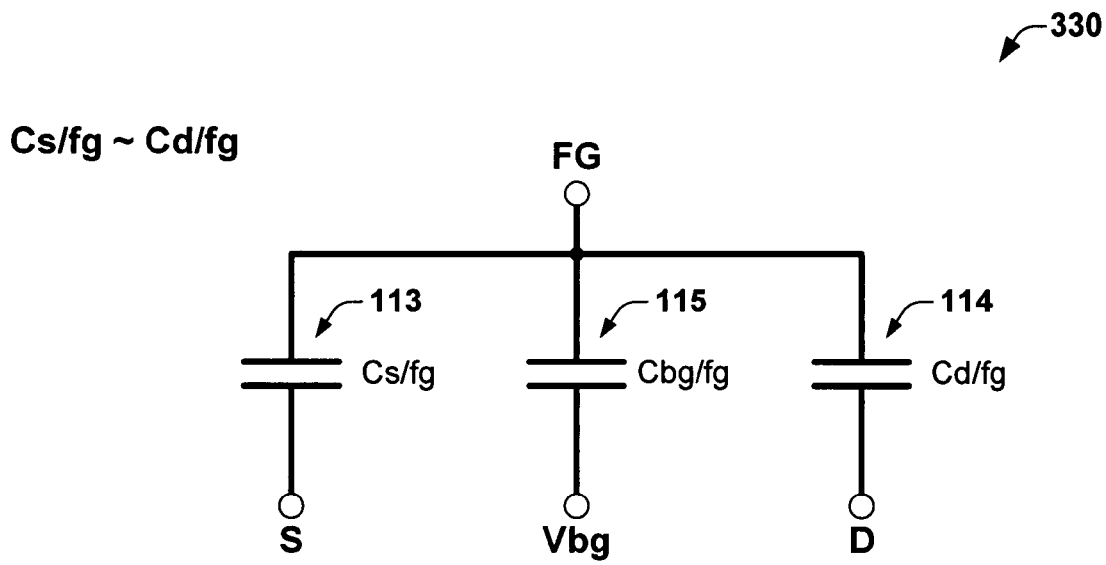
FIG. 3B is a schematic diagram of equivalent circuit capacitances formed between the floating gate and the source (S), drain (D), and back-gate (BG) electrodes of the conventional floating gate memory device of FIG. 3A.

FIG. 3B illustrates an equivalent circuit of the source capacitance Cs/fg 113, drain capacitance Cd/fg 114 and back-gate capacitance Cbg/fg 115, formed between the floating gate and the source (S), drain (D), and back-gate (BG) electrodes respectively, of the conventional floating gate memory device 300 of FIG. 3A. The floating-gate electrode FG is common to the other source (S), drain (D), and back-gate (BG) electrodes.

FIGS. 3C and 3D illustrate the circuit capacitances between the source (S), drain (D), and back-gate (BG) electrodes of the single-poly EEPROM memory device of the present invention (e.g., the EEPROM memory devices of FIGS. 4A-5C, which will be discussed infra), wherein capacitive voltage divider 340 is formed during program and erase memory operations, respectively. This fact, that a voltage divider is formed during program or erase operations, is true in both the present invention as well as in the prior art floating gate memory cell of FIGS. 1A-1C and 3A.

The inventors of the present invention, however, have further appreciated that the capacitances which form the capacitive voltage divider may be substantially manipulated in the exemplary single-poly EEPROM memory device of the present invention in order to provide program and erase capabilities, without adding a control gate CG and the accompanying area penalty. That is, the relationship between these capacitances, or "coupling ratio" Cr, may be significantly manipulated to provide EEPROM capabilities to a floating gate memory device of the present invention.

For example, the inventors have appreciated that in prior art floating gate memory devices the source capacitance Cs/fg 113 and back-gate capacitance Cbg/fg 115 is approximately equal to the drain capacitance Cd/fg 114 (when Cbg/fg is relatively small), and that this ratio causes the source-to-floating gate voltage drop (e.g., Vg, when Vs=0) to be substantially equal to the drain-to-floating gate voltage drop (e.g., Vd, when Vs=0). In addition, the inventors have also appreciated that if the source capacitance Cs/fg 113 is fabricated to be substantially greater than (about 10:1) the drain capacitance Cd/fg 114 (Cs/fg>Cd/fg or Cs/fg>>Cd/fg), that this ratio increase causes the drain-to-floating gate voltage drop (e.g., Vd, when Vs=0) to be substantially greater than (e.g., about 10:1) the source-to-floating gate voltage drop (e.g., Vfg, when Vs=0). Although not to scale, Cs/fg 113 has been graphically illustrated in FIGS. 3C and 3D to be larger than Cd/fg 114 or Cbg/fg 115 to simply communicate this basic concept.

This capacitance ratio or coupling ratio Cr, for example, may be expressed as a drain to floating gate coupling ratio Cr of the voltage divider 340 of FIGS. 3C and 3D. The coupling ratio Cr may then, in turn, be expressed as a corresponding voltage ratio (Vr) of the voltage divider, such as:

$$Cr=(Cd/fg)/(Cd/fg+Cbg/fg+Cs/fg)=Vfg/Vd \text{ (assuming } Vs=Vbg=0) \quad \quad 1)$$

Or: A source to floating gate coupling ratio Cr may be similarly expressed as:

$$Cr=(Cs/fg)/(Cd/fg+Cbg/fg+Cs/fg)=Vfg/Vs \quad \quad 2)$$

For example, voltage divider 340 of FIG. 3C illustrates that during programming Vs and Vbg may be set to 0 volts, while Vd may be set to −10 volts. Because the source-to-floating gate capacitance Cs/fg 113 is fabricated to be substantially greater than the drain-to-floating gate capacitance Cd/fg 114 (Cs/fg>Cd/fg or Cs/fg>>Cd/fg), significantly more voltage is dropped across capacitance Cd/fg 114 (corresponding to Vd) than is dropped across capacitance Cs/fg 113 (corresponding to Vs). The beneficial effect of this low drain voltage Vd (−10V) and high Vfg (−1 V) during programming is that, the floating gate FG becomes much more positively biased than the drain such that hot electrons 342 are then injected into the floating gate FG and the EEPROM is turned ON.

During erasing, for example, in the voltage divider 340 of FIG. 3D, Vs and Vbg may be set to −10 volts, while Vd may be set to 0 volts. Again, because the Cs/fg 113 is fabricated to be substantially greater than Cd/fg 114 (Cs/fg>>Cd/fg), significantly more voltage is again dropped across capacitance Cd/fg 114 (corresponding to Vd) than is dropped across capacitance Cs/fg 113 (corresponding to Vs). However, this time the voltage is reverse biased, causing the floating gate to become much more negatively biased than the drain. The beneficial effect of this high reverse bias voltage on the drain Vd (0V) and low Vfg (−9 V) during erasing, is that electrons 352 will be removed or attracted away from the floating gate FG, wherein the increased coupling ratio Cr between the source and the floating gate FG allows for Fowler-Nordheim erasure of the single-poly EEPROM of the present invention.

Figure 3E:
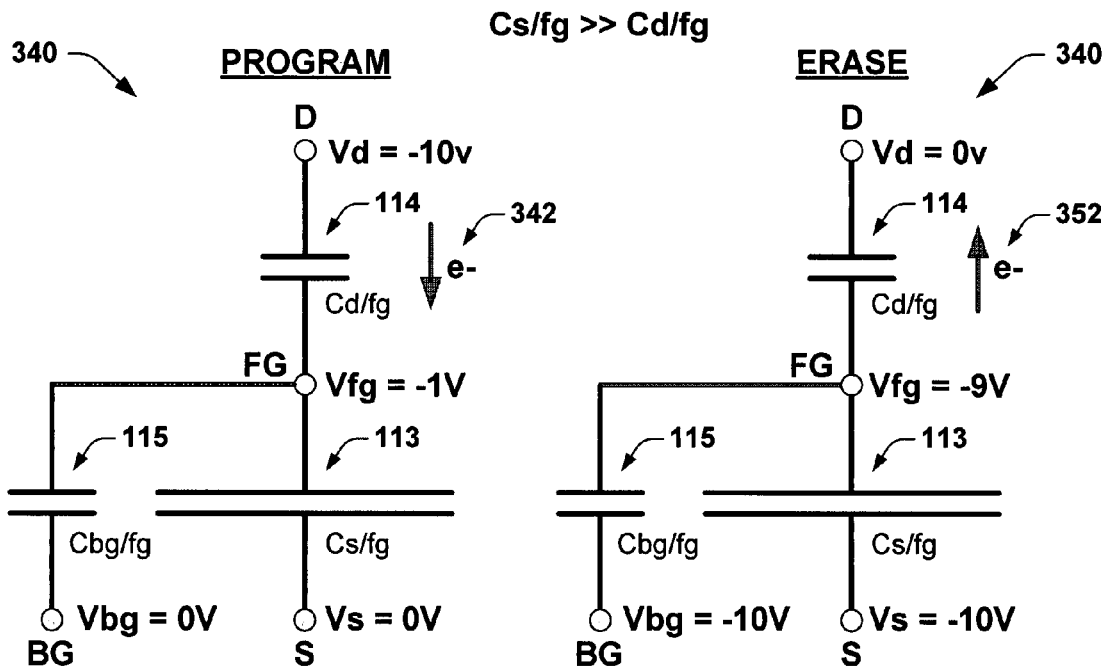
FIG. 3E illustrates two exemplary memory operation charts, such as may be used in accordance with an exemplary single-poly EEPROM memory device of the present invention, illustrating the voltages required at the various memory device electrodes employed for program, erase and read operations utilizing the capacitive voltage dividers formed between the floating gate and the source (S), drain (D), and back-gate (BG) electrodes of the floating gate memory device of the present invention.

FIG. 3E illustrates two example memory operations charts 370 and 380 such as may be used in association with the exemplary single-poly EEPROM memory device of the present invention (e.g., the EEPROM memory devices of FIGS. 4A-5C, which will be discussed infra) and the voltage divider 340 of FIGS. 3C and 3D. Charts 370 and 380 illustrate exemplary voltages that may be applied to the various memory device electrodes employed for program, erase, and read operations utilizing the capacitive voltage divider 340 formed between the floating gate and the source (S), drain (D), and back-gate (BG) electrodes of the floating gate memory devices of the present invention.

Chart 370 of FIG. 3E, for example, illustrates that during programming, such as in the voltage divider 340 of FIG. 3C, a negatively biased (e.g., Vd=−11V) may be applied to the drain D, while a more positively biased voltage (e.g., Vs=Vfg=0V) may be applied to the source S and back-gate BG, respectively. The back gate voltage Vbg is optionally applied at the n-well potential in this and other examples, however, the use of the back gate terminal BG and the voltage applied thereto may also be considered optional in the context of the present invention, particularly if the back gate-to-floating gate capacitance Cbg/fg 115 is relatively small in relation to Cs/fg 113 and Cd/fg 114.

Accordingly, the inventor has appreciated that a floating gate memory device configuration was needed that permits the source-to-floating gate capacitance Cs/fg 113 to be fabricated substantially greater than the drain-to-floating gate capacitance Cd/fg 114 (Cs/fg>>Cd/fg), while also maintaining some level of memory device performance by utilizing substantially the same channel length and width characteristics of a corresponding OTP EPROM memory device. The inventor has realized that such a goal may be attained by using the floating gate to physically cover a larger portion of the source region than the drain region in accordance with the present invention illustrated hereinafter. The inventor has also realized that such a goal may be attained by physically separating the current carrying portion of the memory device, which may be represented as the basic OTP EPROM portion, from the non-current carrying portions of the device in accordance with the present invention illustrated hereinafter.

FIGS. 4A-4C are cross sectional front, top plan, and cross sectional side views, respectively, of an embodiment of an EEPROM memory device 400 (EEPROM1) at a later stage of fabrication, having a source-to-floating gate capacitance (e.g., Cs/fg 113 of FIGS. 3C and 3D) that is substantially larger or greater than the drain-to-floating gate capacitance (e.g., Cd/fg 114 of FIGS. 3C and 3D) and (Cs/fg>>Cd/fg), in accordance with an aspect of the present invention.

EEPROM 1 or EEPROM memory device 400 comprises a single-poly EEPROM having gate structures 402 formed overlying a substrate 404 in which an n-well 406 active region is formed and bounded by shallow trench isolation regions STI 408. PSD source/drain regions 410 are formed into the active regions 406 around the perimeter or edges of the gate 402 having a gate oxide layer 412 formed over active regions and the source/drain regions 410, the gate further includes a polysilicon floating gate 414 formed overlying the gate oxide layer 412.

A P(−) type implant region 430 underlying the edges or perimeter of the floating polysilicon gate 414, defines a width dimension (W of FIGS. 4A and 4B, which is similar to 120 of FIG. 3A) of a capacitive structure residing in both of the source S and drain D regions.

EEPROM 1 further comprises a basic OTP EPROM portion 403, wherein the source or drain to floating gate capacitances 113 or 114, respectively, are further defined physically in part by the width dimension W, the channel width W', and the thickness of the gate oxide layer 412. Within the basic OTP EPROM portion 403, it will be appreciated that the source and drain capacitances are substantially equal. However, it will also be appreciated from FIGS. 4A-4C, and in particular FIG. 4A, that the source S region further comprises additional source to floating gate capacitance regions outside of the basic OTP EPROM portion 403, which is additionally defined in part by the P(−) type implant region 430 underlying the edges or perimeter of the floating gate 414 defining the width dimension W, the length dimensions 4(X+Y), and the thickness of the gate oxide layer 412. The "4" in the previous expression comes from the observation that there may be, for example, four projections or fingers extending into the source PSD region 410. The drain D region does not have these additional underlying capacitive structures, thus, the source-to-floating gate capacitance (e.g., Cs/fg 113 of FIGS. 3C and 3D) is substantially greater than the drain-to-floating gate capacitance (e.g., Cd/fg 114 of FIGS. 3C and 3D).

It will be appreciated that the above dimensions also indicate that the perimeter around the edges of the floating gate, as observed in the source region, is significantly greater than the perimeter available in the drain region.

Stated another way, it will also be appreciated from FIGS. 4A-4C that the floating gate 414 overlies a portion of the source and drain regions 410; however, substantially more of the floating gate 414 overlies the source region S than the drain region D. This relationship communicates the relative real estate area difference as well as the capacitive area difference between the source and drain regions.

Thus, whether comparing the floating gate area, capacitive area, capacitance, or perimeter length, each of these quantities are substantially greater in the source region than in the drain region in accordance with several aspects of the present invention. Because each of these quantities are substantially the same within the confines of the basic OTP EPROM portion 403, it will further be appreciated that it is the area portion outside the basic OTP EPROM portion 403 which contributes the increase in these quantities and which functionally and operationally transforms a basic OTP EPROM 403 into a fully functional EEPROM memory device 400. Although the present invention utilizes the portion outside the basic OTP EPROM portion 403 for such area, capacitance, and perimeter length quantity increases and EEPROM functionality enablement, it is anticipated that some areas within the basic OTP EPROM portion 403 may also be utilized in another embodiment for such quantity increases and/or functionality enablement.

The basic OTP EPROM portion 403 further comprises a contact 424, which connects a first source/drain region 410 to a drain terminal D, and another contact 424, which connects a second source/drain region 410 to a source terminal S. A current path may be established within the basic OTP EPROM portion 403 between the source S and drain D terminals and through the channel region 411 therebetween. Thus, the basic OTP EPROM portion 403, of the present invention may also be characterized or represented by a current carrying portion 403, and a non-current carrying portion of the source region S 410 of memory device 400 outside the current carrying portion 403, wherein substantially more of the floating gate 414 overlies the non-current carrying portion of the source region than the current carrying portions 403 of the source and drain regions 410.

That is, within portion 403, substantially all of the memory device current will be conducted between the source S and drain D electrodes, while the (e.g., 1, 2, 4, or more) projections are substantially non-current carrying portions. This is because the projections are positioned tangential to, or perpendicular to the current path between the source and drain, and thus do not substantially contribute to the completion of the current path between the source and drain electrodes. In addition, areas of the exemplary projections residing beyond the source electrode or beyond the extents of the current path between the source and drain electrode will also not substantially contribute to the current path.

Figure 5A:
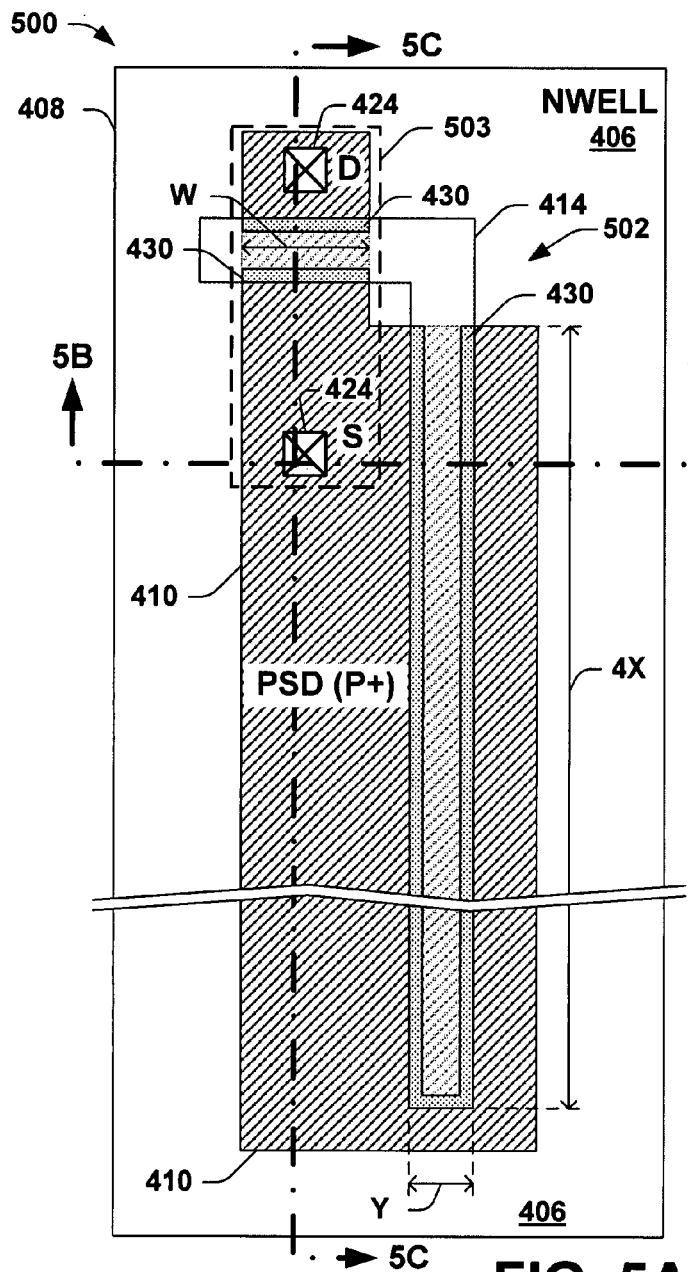
FIGS. 5A-5C are cross sectional front, top plan, and cross sectional side views, respectively, of another embodiment of a EEPROM memory device (EEPROM2) at a later stage of fabrication; the device has a source-to-floating gate capacitance that is substantially larger than the drain-to-floating gate capacitance in accordance with another aspect of the present invention.
Figure 5C:
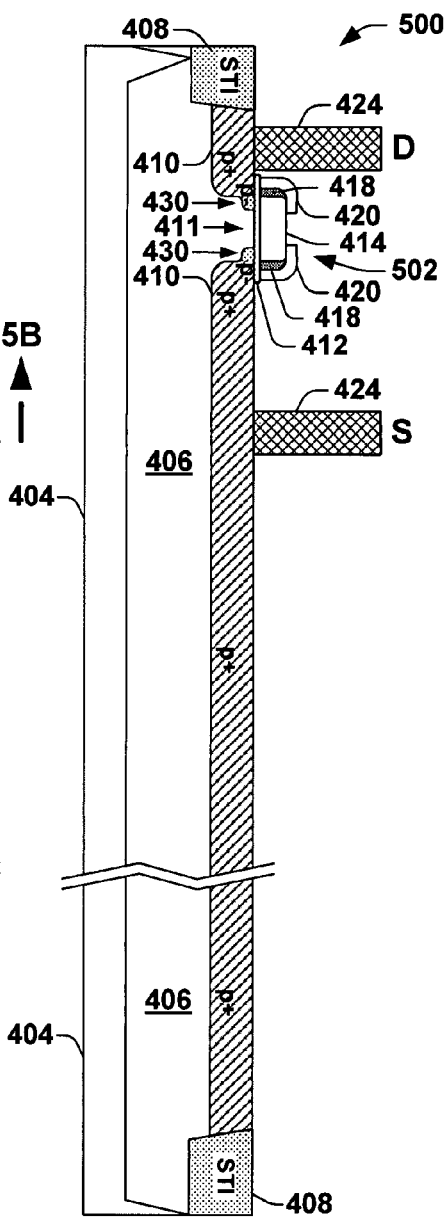
Figure 5B:
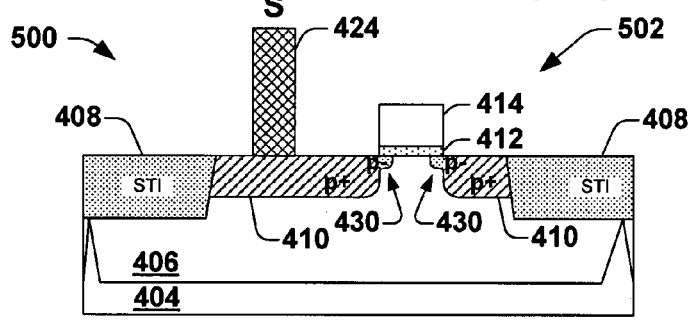

FIGS. 5A-5C are cross sectional front, top plan, and cross sectional side views, respectively, of another embodiment of an EEPROM memory device 500 (EEPROM2) at a later stage of fabrication. EEPROM memory device 500 has a source-to-floating gate capacitance (e.g., Cs/fg 113 of FIGS. 3C and 3D) that is substantially larger or greater than the drain-to-floating gate capacitance (e.g., Cd/fg 114 of FIGS. 3C and 3D) and (Cs/fg>>Cd/fg), in accordance with an aspect of the present invention.

EEPROM 2 or EEPROM memory device 500 comprises a single-poly EEPROM having gate structures 502, wherein the device 500 is formed similar to that of EEPROM 1 of FIGS. 4A-4C, and, as such, need not be fully described again for the sake of brevity.

Again, a P(−) type implant region 430 underlying the edges or perimeter of the floating polysilicon gate 414, defines a width dimension (W of FIGS. 5A and 5B) of a capacitive structure residing in both of the source S and drain D regions.

EEPROM 2 also further comprises a basic OTP EPROM portion 503, wherein the source or drain to floating gate capacitances 113 or 114, respectively, are further defined physically in part by the width dimension W, the channel width W', and the thickness of the gate oxide layer 412. Within the basic OTP EPROM portion 503, it will be appreciated that the source and drain capacitances are substantially equal. However, it will also be appreciated from FIGS. 5A-5C, and in particular FIG. 5A, that the source S region further comprises additional source to floating gate capacitance regions outside of the basic OTP EPROM portion 503, which is additionally defined in part by the P(−) type implant region 430 underlying the edges or perimeter of the floating gate 414, defining the width dimension W, the length dimensions 4X+Y, and the thickness of the gate oxide layer 412. The "4" in the previous expression comes from the observation that the length of the single projection or finger, for example, may extend four times further into the source PSD region 410 than that of FIGS. 4A-4C.

Thus, the present embodiment of the single-poly EEPROM 500 (EEPROM 2) may be fabricated with the same capacitances or different capacitances as compared to EEPROM 1. Again, it will be appreciated that the drain D region does not have these additional underlying capacitive structures, thus, the source-to-floating gate capacitance (e.g., Cs/fg 113 of FIGS. 3C and 3D) is substantially greater than the drain-to-floating gate capacitance (e.g., Cd/fg 114 of FIGS. 3C and 3D).

Again, whether comparing the floating gate area, capacitive area, capacitance, perimeter length, or the non-current carrying portions, each of these quantities are substantially greater (e.g., at least about three times greater, preferably about five times greater, but generally less than about twenty times greater) in the source region than in the drain region in accordance with several aspects of the present invention. Because each of these quantities are substantially the same within the confines of the basic OTP EPROM portion 503, it will further be appreciated that it is the area portion outside the basic OTP EPROM portion 503 which contributes the increase in these quantities and which functionally and operationally transforms a basic OTP EPROM 503 into a fully functional EEPROM memory device 500. Although the present invention utilizes the portion outside the basic OTP EPROM portion 503 for such area, capacitance, and perimeter length quantity increases and EEPROM functionality enablement, it is anticipated that some areas within the basic OTP EPROM portion 503 may also be utilized in another embodiment for such quantity increases and/or functionality enablement.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A single-poly EEPROM memory device, comprising:
    source and drain regions of said single-poly EEPROM memory device in a semiconductor body of a first conductivity type; and
    a floating gate overlying a portion of the source and drain regions;
    wherein substantially more of the floating gate overlies the source region than the drain region and further wherein the memory device is configured to be electrically programmed or erased without the use of a control gate.

2. The memory device of claim 1, wherein the memory device further comprises a source electrode connected to the source region, a drain electrode connected to the drain region, and a back-gate electrode connected to a back-gate region of the semiconductor body.

3. The memory device of claim 1, wherein the portion of the floating gate overlying the source region is at least about three times larger than the portion of the floating gate overlying the drain region.

4. The memory device of claim 1, wherein the portion of the floating gate overlying the source region that is substantially more than the portion of the floating gate overlying the drain region overlies a non-current carrying portion of the source region.

5. The memory device of claim 1, wherein the source region portion that is substantially more than the drain region portion is a non-current carrying portion of the source region.

6. The memory device of claim 1, wherein the memory device comprises one of a single-poly EEPROM, and a modified OTP EPROM.

7. The memory device of claim 1, wherein the portion of the floating gate overlying the source region is sufficiently larger than the portion of the floating gate overlying the drain region to enable the memory device to be electrically programmed and erased.

8. The memory device of claim 7, wherein the memory device is configured to be electrically programmed or erased by applying a potential between a source electrode and a drain electrode.

9. The memory device of claim 1, wherein the floating gate overlying the portion of the source and drain regions, respectively defines:
    a source-to-floating gate capacitance; and
    a drain-to-floating gate capacitance;
    wherein the source-to-floating gate capacitance is substantially greater than the drain-to-floating gate capacitance.

10. The memory device of claim 9, wherein the source-to-floating gate capacitance is sufficiently larger than the drain-to-floating gate capacitance to enable the memory device to be electrically programmed or erased.

11. The memory device of claim 10, wherein the source-to-floating gate capacitance is at least about three times greater and less than about twenty times greater than the drain-to-floating gate capacitance.

12. The memory device of claim 1, wherein the memory device further comprises:
    a source electrode connected to the source region;
    a drain electrode connected to the drain region;
    current carrying portions of the source and drain regions generally defined by a current path between the source and drain electrodes, respectively; and
    a non-current carrying portion of the source region generally residing outside the current carrying portion of the source region, in a portion of the source region that extends in a direction tangential to the current path, or in a portion of the source region that extends in a direction along the current path and beyond the source electrode.

13. The memory device of claim 12, wherein the non-current carrying portion of the source region is substantially larger than the current carrying portions of the source and drain regions.

14. A single-poly EEPROM memory device, comprising:
    source and drain regions of said single-poly EEPROM memory device in a semiconductor body of a first conductivity type; and
    a floating gate overlying a portion of the source and drain regions, thereby respectively defining:
        a source-to-floating gate capacitance; and
        a drain-to-floating gate capacitance;
        wherein the source-to-floating gate capacitance is substantially greater than the drain-to-floating gate capacitance and further wherein the memory device is configured to be electrically programmed or erased without the use of a control gate.

15. The memory device of claim 14, wherein the memory device further comprises a source electrode connected to the source region, a drain electrode connected to the drain region, and a back-gate electrode connected to a back-gate region of the semiconductor body.

16. The memory device of claim 14, wherein the source-to-floating gate capacitance is at least about three times greater and less than about twenty times greater than the drain-to-floating gate capacitance.

17. The memory device of claim 14, wherein the source-to-floating gate capacitance is sufficiently greater than the drain-to-floating gate capacitance to enable the memory device to be electrically programmed or erased.

18. The memory device of claim 17, wherein the source-to-floating gate capacitance is at least about three times the drain-to-floating gate capacitance.

19. The memory device of claim 17, wherein the memory device is configured to be electrically programmed or erased by applying a potential between a source electrode and a drain electrode.

20. The memory device of claim 14, wherein the memory device further comprises:
    a source electrode connected to the source region;
    a drain electrode connected to the drain region;
    current carrying portions of the source and drain regions generally defined by a current path between the source and drain electrodes, respectively; and
    a non-current carrying portion of the source region generally residing outside the current carrying portion of the source region, in a portion of the source region that extends in a direction tangential to the current path, or in a portion of the source region that extends in a direction along the current path and beyond the source electrode.

21. The memory device of claim 20, wherein the non-current carrying portion of the source region is substantially larger than the current carrying portions of the source and drain regions.

22. A single-poly EEPROM memory device, comprising:
    source and drain regions of said single-poly EEPROM memory device in a semiconductor body of a first conductivity type; and
    a floating gate overlying a portion of the source and drain regions, thereby respectively defining:
        a drain-to-floating gate perimeter length; and
        a source-to-floating gate perimeter length;
        wherein the source-to-floating gate perimeter length is substantially greater than the drain-to-floating gate perimeter length and further wherein the memory device is configured to be electrically programmed or erased without the use of a control gate.

23. A single-poly EEPROM memory device, comprising:
    source and drain regions of said single-poly EEPROM memory device in a semiconductor body of a first conductivity type;
    a floating gate overlying a portion of the source and drain regions;
    a source electrode connected to the source region;
    a drain electrode connected to the drain region;
    current carrying portions of the source and drain regions generally defined by a current path between the source and drain electrodes, respectively; and
    a non-current carrying portion of the source region generally residing outside the current carrying portion of the source region;
    wherein substantially more of the floating gate overlies the non-current carrying portion of the source region than the current carrying portions of the source and drain regions and further wherein the memory device is configured to be electrically programmed or erased without the use of a control gate.

24. The memory device of claim 23, wherein the non-current carrying portion of the source region generally residing outside the current carrying portion of the source region comprises one of:
   a portion of the source region that extends in a direction tangential to the current path; and
   a portion of the source region that extends in a direction along the current path and beyond the source electrode.

25. The memory device of claim 23, wherein the memory device is configured to be electrically programmed or erased by applying a potential between the source and drain electrodes.

26. The memory device of claim 23, wherein the non-current carrying portion of the source region is at least about three times larger than the current carrying portions of the source and drain regions.

27. The memory device of claim 23, wherein the memory device comprises one of a single-poly EEPROM, and a modified OTP EPROM.

* * * * *